United States Patent [19]

Dorfman et al.

[11] Patent Number: 5,294,567
[45] Date of Patent: Mar. 15, 1994

[54] METHOD FOR FORMING VIA HOLES IN MULTILAYER CIRCUITS

[75] Inventors: Jay R. Dorfman, Durham; Richard R. Draudt, Pittsboro; Thomas D. Lantzer, Fuquay-Varina; Arthur H. Mones, Cary; David L. Sutton, Raleigh, all of N.C.

[73] Assignee: E. I. Du Pont de Nemours and Company, Wilmington, Del.

[21] Appl. No.: 2,247

[22] Filed: Oct. 8, 1993

[51] Int. Cl.⁵ ............................................. H01L 21/44
[52] U.S. Cl. ..................................... 437/187; 437/173; 437/235; 148/DIG. 69; 148/DIG. 93
[58] Field of Search .............. 437/187, 173, 235, 935; 148/DIG. 69, DIG. 93

[56] References Cited

U.S. PATENT DOCUMENTS

| | | | |
|---|---|---|---|
| 4,806,188 | 2/1989 | Rellick | 156/89 |
| 4,965,702 | 10/1990 | Lott et al. | |
| 5,066,357 | 11/1991 | Smyth, Jr. et al. | 156/643 |
| 5,194,713 | 3/1993 | Egitto et al. | 219/121.71 |
| 5,213,876 | 5/1993 | Smyth, Jr. et al. | 428/209 |

OTHER PUBLICATIONS

Tessier, T. G., et al. "Compatibility of Common MCM-D Dielectrics with Scanning Laser Ablation Via Generation Processes" 42nd Electronics Components and Tech. Conf., IEEE, 1992, pp. 763-769.

Gower, M. C., et al., "Excimer Laser Projector for Materials Processing Applications", Laser Ablation of Electronic Materials, 1992, pp. 255-262.

*Primary Examiner*—Olik Chaudhuri
*Assistant Examiner*—C. Everhart

[57] ABSTRACT

The invention is directed to a method for rapidly forming a dense pattern of via holes in multilayer electronic circuits in which via holes in the dielectric layers are formed by drilling with an excimer laser under controlled operating conditions.

13 Claims, No Drawings

METHOD FOR FORMING VIA HOLES IN MULTILAYER CIRCUITS

FIELD OF INVENTION

The invention is directed to a method for forming via holes in inorganic dielectric layers. More particularly, the invention is directed to a method for rapidly forming dense patterns of via holes in dielectric layers for use in multilayer circuits.

BACKGROUND OF THE INVENTION

Vias are electrically conductive paths which are used to connect operably adjoining layers of multilayer circuits. The conventional method for producing vias in multilayer circuits is to screen print a pattern of dielectric paste over an underlying conductive pattern by which via holes are formed by the opaque areas of the screen. The printed dielectric layer is then fired and the via holes are filled by screen printing with a conductive thick film paste. Another method for making vias is to punch holes in a dielectric green (unfired) tape, fill the via holes by screen printing in the above-described manner, and fire the tape to remove the organic medium. These methods for making vias for multilayer circuits are, however, limited in that evenly shaped, symmetrical vias can be made reliably only if they are 8-10 mils in diameter or larger for thick film and 4 mils in diameter or larger for green tape. When it is attempted to make smaller vias by these methods, the via holes tend to fill in during printing and firing.

In an attempt to improve upon the conventional screen printing method, various experimenters have suggested the use of laser drilling to form the vias. For example, Cocca et al. have suggested the laser drilling of unfired thick film dielectrics overlying thick film conductors (Cocca et al, Laser Drilling of Vias in Dielectric for High Density Multilayer Thick Film Circuits, *Solid State Technology*, September 1978, p 63-66). In drilling via holes by this method, Cocca et al used a pulsed YAG laser at a power level of 42-47 mj using a single laser pulse, which resulted in the removal of the gold conductor pattern underlying the laser-drilled via hole. In addition, Barrett et al. disclosed the laser drilling of fired dielectric layers using a pulsed YAG laser set at 1 W having a Q-rate of 1 kHz. The study showed that the depth of the drilled holes was related directly to the number of pulses at a given power level (Barret et al., A Method for Scanning Electron Microscope Analysis of Laser Drilled Thick Film Vias, *Hybrid Circuits*, No. 4, Spring 1984, p 61-63).

More recently, Kawasaki et al, in copending patent application S.N. PCT/US 90/06160, filed Oct. 25, 1990, disclosed the use of a laser beam to form via holes in an inorganic insulating (dielectric) layer having a transparent protective layer on a beam-reflective substrate, filling the via holes with thick film paste, removing the protective layer, and then repeating the sequence to obtain the desired number of layers, after which the entire assemblage is cofired.

In addition, Wang in pending U.S. patent application Ser. No. 07/739.205 filed Aug. 1, 1991 disclosed a method for drilling via holes in unfired dielectric layers using a YAG laser under carefully controlled operating conditions including a pulse rate of 1 kHz. The pulsed laser beam is positioned by means of a galvonometric beam positioner to facilitate rapid drilling sequence of single holes.

Each of the prior art methods for laser drilling via holes uses either a YAG or $CO_2$ laser or relatively long wave length lasers, which rely upon the application of intense heat to effect almost explosive ablation of the organic materials. Such methods are suitable for many applications. However, they are less desirable for drilling very small vias because the resolution of the vias is less than desired. Fine via resolution is particularly important when the multilayer device contains dense patterns of vias, e.g. 20 vias/$cm^2$ or greater.

SUMMARY OF THE INVENTION

The invention is therefore directed in its primary aspect to a method for rapidly forming a high density patterned array of via holes of predetermined size in an unfired layer comprising finely divided particles of dielectric solids dispersed in an ablatable organic medium containing substantially no volatile organic solvents, the layer having a thickness of 1-1,000 micrometers, comprising the sequential steps of:

(a) providing a beam dividing device which splits a single excimer laser light beam into a plurality of smaller beams of predetermined size arranged in the pattern of a selected segment of the patterned array of via holes;

(b) adjusting the relative position of the beam dividing device between the upper exposed surface of the unfired layer and a source of excimer laser light to enable directing the plurality of smaller excimer laser light beams in a patterned array from the beam dividing device onto a preselected area of the surface of the unfired layer;

(c) directing the plurality of smaller excimer laser light beams onto the surface of the dielectric layer at (1) a power level of 0.1-10 J/$cm^2$ and (2) a drilling rate of 0.2-2 micrometer per pulse to effect complete ablation of the organic medium from the areas of the dielectric layer exposed to the laser beams without incurring densification of the dielectric solids therein; and (d) repeating steps (b) and (c) in further preselected areas of the unfired layer until the patterned array of via holes in the unfired layer has been completed.

DETAILED DESCRIPTION OF THE INVENTION

A. In General

The method of the invention is directed to the task of forming via holes and vias in multilayer electronic circuits both quickly and accurately. In particular, the invention is directed to the task of forming extensive patterns of fine (4-6 mils) or smaller vias in green tape and thick film dielectric materials both accurately and rapidly before the layers are fired.

Vias in multilayer electronic circuitry are used to connect electrically the circuit patterns of one layer to another layer where the conductive layers are separated by a relatively thin layer of dielectric material. Because of the substantial circuit density necessary to minimize the areal requirements of complex multilayer circuits, it is essential that the vias be made accurately both as to placement and as to configuration and that they be made very rapidly. For example, a single dielectric layer of a 4×4 inch multilayer circuit may require on the order of 10,000 vias and the device made therefrom may contain as many as 60 such layers. Moreover, such devices are frequently required to be produced in large quantities, e.g. several thousand per day.

The prior art is replete with teachings of the use of lasers to mark and to drill holes through various organic and inorganic materials, including dielectric layers for multilayer circuits. Indeed, substantial progress has been made with respect to drilling via holes very rapidly at suitable manufacturing rates. However, as the line widths and spaces of multilayer devices become finer and the patterns of via holes become denser, it becomes increasingly important that the resolution of the holes be improved. This, applicants have found can be achieved to a very high degree by the use of short wave length beams such as those produced by use of an excimer laser.

B. Excimer Lasers

Excimer lasers are high power lasers which generate concentrated light beams in the ultra-violet frequency range. Their lasing capability is based upon the excitation of various diatomic gas molecules. Thus, the terminology "excimer" is derived as an abbreviation of "excited dimers". In particular, excimer lasers constitute a family of lasers which emit light in the wavelength range of 157–353 nm. The four most common excimers are XeF (353, 353 nm), XeCl (308 nm), KrF (248 nm) and ArF (193 nm), of which the latter two are preferred for use in this invention. An advantage of the excimer laser in its application to the invention is that the light therefrom is more capable of inducing photochemical reactions in organic film layers. In fact, it has been asserted that "The short wavelength output of the excimer laser can actually break chemical bonds directly, hence offering a non-thermal means of controlling a reaction." (Znotins, T. A., Excimer Lasers: An Emerging Technology in Semiconductor Processing, *Solid State Technology*, September, 1986) In particular, similar degrees of reaction can be obtained at considerably less severe thermal conditions.

Beam Dividing

Because of the rather large beam size of the beam from an excimer laser, the beam can readily be divided into a large number of smaller beams of appropriate size for via drilling. Thus, one advantage of the excimer laser in this application is the fact that a large number of via holes can be drilled simultaneously. Thus, it is unnecessary to reposition the target or the laser light source, as the case may be, after each hole is completed. Moreover, those via holes can be of different sizes and shapes if that is desired. Furthermore, this invention is not limited to the creation of vias. It is also useful for ablation of substrates to form cavities or depressions.

Beam division is accomplished either by the use of conventional masks or optically by the use of such devices as computer generated holograms. To illustrate, a conventional mask comprising opaque and transparent or open areas in the pattern of the via holes to be formed is placed between the laser light source and the unfired dielectric layer to be drilled. The mask can be placed directly on the dielectric surface or it can be removed from the surface and the beams are focused by means of a system of optical lenses. It will be recognized that in transitioning from one area of the dielectric layer to another, either the piece to be drilled can be moved, the laser light source can be moved, or both can be moved to effect repositioning of the laser beam on the work piece.

Materials

One of the many advantages of the method of the invention is that it can be carried out using conventional thick film conductive and dielectric materials and dielectric green tapes as well as the conventional techniques for applying these materials to the formation of electrical circuitry.

Thus the conductive layers or metallizations can be formed from conventional thick film conductive pastes comprised of finely divided particles of conductive metal or metal oxide dispersed in an organic medium having appropriate rheology for screen printing application. Such printable thick film pastes may also contain finely divided particles of inorganic binder. After being printed in an appropriate circuit pattern, the conductive thick film layer is fired to effect volatilization of the organic medium and sintering of the solid components.

The dielectric layers are preferably formed by laminating one or more layers of dielectric green tape. Dielectric green tapes are comprised of finely divided dielectric materials such as barium titanate, alumina or glass dispersed in a polymeric matrix which is pyrolyzable when the laminated tape is fired in either an oxidizing or nonoxidizing atmosphere. Upon firing, the polymeric matrix is pyrolyzed (burned out) and the dielectric material is sintered and/or densified. The dielectric layers can also be formed by applying a layer of thick film dielectric paste.

Such thick film conductor compositions and dielectric green tapes and the methods of applying them are well known in the electronic materials art.

A sine qua non of all substrate materials to be used in the invention is that they must be rigid when formed into thin layers (e.g., 600 microns) and they must be dimensionally stable. That is, they should not undergo any substantial degree of bowing when they are fired. Most frequently, the substrates used for the invention will be made from electrically insulative ceramic materials such as alumina. However, in some instances, substrates can be used which are made from laminated green tapes, heat-conductive metals or from ceramic-coated metals such as porcelainized steel.

Via holes in green tape layers are typically filled by either of two methods. In one technique, the via holes are filled by screen printing a thick film conductive paste directly into the via holes. In another method, the via holes are filled during screen printing of an overlying conductive layer by flow of the thick film paste into the via holes.

The method of the invention can be used to prepare multilayer circuits containing, for example, 15–60 conductive layers. Green tapes will usually have thicknesses of from about 50 to 400 micrometers. On the other hand, unfired thick film layers will usually have thicknesses of 25–50 micrometers.

The method of the invention can be, however, used to drill holes through dielectric materials as thick as 1000 mils.

EXAMPLES

To illustrate the utility of the invention for ablation in dielectric substrates, a series of four different green tapes were laser drilled using the beam of an excimer laser at different power levels on two different green tape compositions. In Examples 1 and 2, the dielectric portion of the tape was a lead borosilicate glass containing an alumina filler and in Examples 3 and 4, the dielectric portion of the tape was a borosilicate glass containing cordierite as a filler. Each of the green tapes were ablated at energy density levels of 3.2 and 8.0 J/cm$^2$. The results of these tests are given in the following table:

| Effect of Power and Film Composition On Drilling Rate of Unfired Green Tape | | | | |
|---|---|---|---|---|
| | Example No. | | | |
| | 1 | 2 | 3 | 4 |
| Tape Composition (% Wt.) | | | | |
| Organics | 10.5 | 9.0 | 11.8 | 10.6 |
| Dielectric Solids | 89.5[1] | 91.0[1] | 88.2[2] | 89.4[2] |
| Energy Density (J/Cm$^2$) | 3.2 | 3.2 | 3.2 | 3.2 |
| Drilling Rate (μm/pulse) | 0.17 | 0.20 | 1.0 | 1.0 |
| Energy Density (J/cm$^2$) | 8.0 | 8.0 | — | — |
| Drilling Rate (μm/pulse) | 0.5 | 0.5 | — | — |

[1] Lead borosilicate glass with alumina filler.
[2] Borosilicate glass with cordierite filler.

The foregoing data show that the power level had a profound effect on the drilling rate, but that minor differences in the relative amounts of organics and dielectric solids did not. Nevertheless, the significantly higher drilling rates for the green tape containing cordierite filler show that the nature of the dielectric solids greatly influences the rate of drilling which are obtainable by use of the invention.

We claim:

1. A method for rapidly forming a high density patterned array of via holes of predetermined size in an unfired layer comprising finely divided particles of dielectric solids dispersed in an ablatable organic medium containing substantially no volatile organic solvents, the layer having a thickness of 1–1,000 micrometers, comprising the sequential steps of:

(a) providing a beam dividing device which splits a single excimer laser light beam into a plurality of smaller beams of predetermined size arranged in the pattern of a selected segment of the patterned array of via holes;

(b) adjusting the relative position of the beam dividing device between the upper exposed surface of the unfired layer and a source of excimer laser light to enable directing the plurality of smaller excimer laser light beams in a patterned array from the beam dividing device onto a preselected area of the surface of the unfired layer;

(c) directing the plurality of smaller excimer laser light beams onto the surface of the dielectric layer at (1) a power level of 0.1–10 J/cm$^2$ and (2) a drilling rate of 0.2–2 micrometer per pulse to effect complete ablation of the organic medium from the areas of the dielectric layer exposed to the laser beams without incurring densification of the dielectric solids therein; and (d) repeating steps (b) and (c) in further preselected areas of the unfired layer until the patterned array of via holes in the unfired layer has been completed.

2. The method of claim 1 in which a stream of gas is directed upon the target areas of the unfired layer following via formation to remove any residual solids remaining in the ablated areas of the dielectric layer.

3. The method of claim 1 in which the laser beam power level is no more than 1 J/cm$^2$.

4. The method of claim 1 in which the laser beam dividing device is an aperture mask comprising areas which are opaque and areas which are transparent to the passage of excimer laser light, the transparent areas being arranged in the pattern of the via holes.

5. The method of claim 4 in which the mask is positioned in conforming contact with the unfired layer.

6. The method of claim 1 in which the laser beam dividing device forms the plurality of laser beams in the patterned array optically by means of a computer generated hologram.

7. The method of claim 1 in which the patterned via density is at least 20 vias per cm$^2$ of area of the unfired layer.

8. The method of claim 1 in which the unfired layer is green tape.

9. The method of claim 1 in which the unfired layer is a thick film paste which has been dried by heating to remove volatile solvent therefrom.

10. The method of claim 1 in which the dielectric solids are comprised of cordierite and borosilicate glass.

11. The method of claim 1 in which the dielectric solids are comprised of alumina and leads borosilicate glass.

12. The method of claim 1 in which the ablatable organic medium is comprised of acrylic polymer(s).

13. The method of claim 1 in which the excimer is selected from XeF and ArF.

* * * * *